United States Patent
Chen et al.

(10) Patent No.: US 9,780,171 B2
(45) Date of Patent: Oct. 3, 2017

(54) FABRICATING METHOD OF LATERAL-DIFFUSED METAL OXIDE SEMICONDUCTOR DEVICE

(71) Applicant: UNITED MICROELECTRONICS CORP., Hsin-Chu (TW)

(72) Inventors: Ming-Shing Chen, Tainan (TW); Wei-Ting Wu, Tainan (TW); Ming-Hui Chang, Tainan (TW); Chao-Chun Ning, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/252,246

(22) Filed: Aug. 31, 2016

(65) Prior Publication Data

US 2016/0372554 A1    Dec. 22, 2016

Related U.S. Application Data

(63) Continuation of application No. 14/071,674, filed on Nov. 5, 2013, now Pat. No. 9,461,166.

(51) Int. Cl.
*H01L 29/78* (2006.01)
*H01L 29/66* (2006.01)
(Continued)

(52) U.S. Cl.
CPC ...... *H01L 29/1083* (2013.01); *H01L 29/0619* (2013.01); *H01L 29/0653* (2013.01);
(Continued)

(58) Field of Classification Search
CPC ........... H01L 29/0878; H01L 29/42368; H01L 29/7816
(Continued)

(56) References Cited

U.S. PATENT DOCUMENTS 6,137,140 A * 10/2000 Efland ................. H01L 27/0711 257/139
6,252,278 B1 * 6/2001 Hsing ................. H01L 29/0878 257/335

(Continued)

OTHER PUBLICATIONS

Han Xiao; Lijie Zhang; Ru Huang; Fei Song; Dake Wu; Huailin Liao; Waisum Wong; Yangyuan Wang; "A Novel RF LDMOS Fabricated With Standard Foundry Technology", Electron Device Letters, IEEE, vol. 30, No. 4, pp. 386-388; Apr. 1, 2009.

(Continued)

*Primary Examiner* — Jonathan Han
(74) *Attorney, Agent, or Firm* — Winston Hsu

(57) ABSTRACT

A lateral-diffused metal oxide semiconductor device including a substrate, a second deep well, a gate, a source, a drain and a first dopant region is provided. The substrate includes a first deep well having a first conductive type. The second deep well having a second conductive type is disposed in the first deep well. The gate is disposed on the substrate and the boundary of the first and the second deep well. The source and the drain having a second conductive type are disposed beside the gate and in the first deep well and the second deep well respectively. The first dopant region having a first conductive type is disposed in the second deep well, wherein the first dopant region is separated from the drain. Moreover, a method for fabricating said lateral-diffused metal oxide semiconductor device is also provided.

12 Claims, 5 Drawing Sheets

(51) Int. Cl.
*H01L 29/06* (2006.01)
*H01L 29/10* (2006.01)
*H01L 29/08* (2006.01)

(52) U.S. Cl.
CPC .. *H01L 29/66659* (2013.01); *H01L 29/66681* (2013.01); *H01L 29/7816* (2013.01); *H01L 29/7835* (2013.01); *H01L 29/0847* (2013.01)

(58) Field of Classification Search
USPC .............. 257/E29.261, 335, 343, E29.012; 438/275, 301, 305, 306
See application file for complete search history.

(56) References Cited

U.S. PATENT DOCUMENTS

| | | | |
|---|---|---|---|
| 6,873,011 B1 * | 3/2005 | Huang | H01L 29/7801 257/335 |
| 7,235,451 B2 | 6/2007 | Hao | |
| 8,026,549 B2 | 9/2011 | Chen | |
| 2004/0201061 A1 * | 10/2004 | Jeon | H01L 29/0634 257/335 |
| 2004/0222461 A1 * | 11/2004 | Peyre-Lavigne | H01L 29/0619 257/333 |
| 2005/0253191 A1 * | 11/2005 | Pendharkar | H01L 29/0847 257/335 |
| 2007/0063274 A1 * | 3/2007 | Kanda | H01L 21/761 257/335 |
| 2011/0163376 A1 | 7/2011 | Cheng | |
| 2012/0126323 A1 | 5/2012 | Wu | |
| 2012/0211832 A1 | 8/2012 | Chu | |

OTHER PUBLICATIONS

Hsu, Title of Invention: Transistor Device and Manufacturing Method Thereof, U.S. Appl. No. 13/525,471, filed Jun. 18, 2012.

* cited by examiner

FABRICATING METHOD OF LATERAL-DIFFUSED METAL OXIDE SEMICONDUCTOR DEVICE

CROSS REFERENCE TO RELATED APPLICATIONS

This patent application is a continuation application of and claims priority to U.S. patent application Ser. No. 14/071,674, filed on Nov. 5, 2013, and entitled "LATERAL-DIFFUSED METAL OXIDE SEMICONDUCTOR DEVICE AND FABRICATING METHOD THEREOF", the entire contents of which are incorporated herein by reference.

BACKGROUND OF THE INVENTION

1. Field of the Invention

The present invention is related to a lateral-diffused metal oxide semiconductor device and fabrication method thereof, and more specifically, to a lateral-diffused metal oxide semiconductor device and fabrication method thereof, which has dopant regions between a gate and a drain.

2. Description of the Prior Art

As manufacturing techniques for semiconductor integrated circuits progress, it is preferable to have controllers, memories and devices for low-voltage operation and power devices for high-voltage operation integrated in one single-chip system. Prior art devices employ an insulated gate bipolar transistor (IGBT) and double-diffused metal oxide semiconductor (DMOS) transistor devices as the power devices of high-voltage operation in the single-chip system.

The DMOS transistor device can be categorized into lateral DMOS (LDMOS) and vertical DMOS (VDMOS) devices. Due to their advantages of higher operational bandwidth, higher operational efficiency, and convenience of integration with other devices such as CMOS devices due to their planar structure, LDMOS devices are more widely used.

SUMMARY OF THE INVENTION

The present invention provides a lateral-diffused metal oxide semiconductor device and a fabricating method thereof, which has at least a dopant region between a gate and a drain, thus reducing circuit leakage, surface electric field and off current.

The present invention provides a lateral-diffused metal oxide semiconductor device including a substrate, a second deep well, a gate, a source, a drain and a first dopant region. The substrate includes a first deep well having a first conductive type. The second deep well having a second conductive type is disposed in the first deep well. The gate is disposed on the substrate and the boundary of the first and the second deep well. The source and the drain having a second conductive type are disposed beside the gate and in the first deep well and the second deep well respectively. The first dopant region having a first conductive type is disposed in the second deep well, wherein the first dopant region is separated from the drain.

The present invention provides a fabricating method of a lateral-diffused metal oxide semiconductor device including the following steps. A substrate is provided. A first deep well with a first conductive type is formed in the substrate. A second deep well with a second conductive type is formed in the first deep well. A gate is formed on the substrate and the boundary of the first and the second deep well. A source and a drain are formed in the first deep well and in the second deep well respectively beside the gate. A first dopant region having a first conductive type is formed in the second deep well and separated from the drain.

According to the above, the present invention provides a lateral-diffused metal oxide semiconductor device and fabrication method thereof, which forms a first dopant region between the gate and the drain for having PN-junctions existing between the first dopant region and the second deep well, to reduce circuit leakage, surface electric field and off current ($I_{off}$).

These and other objectives of the present invention will no doubt become obvious to those of ordinary skill in the art after reading the following detailed description of the preferred embodiment that is illustrated in the various figures and drawings.

DETAILED DESCRIPTION

Figure 1:
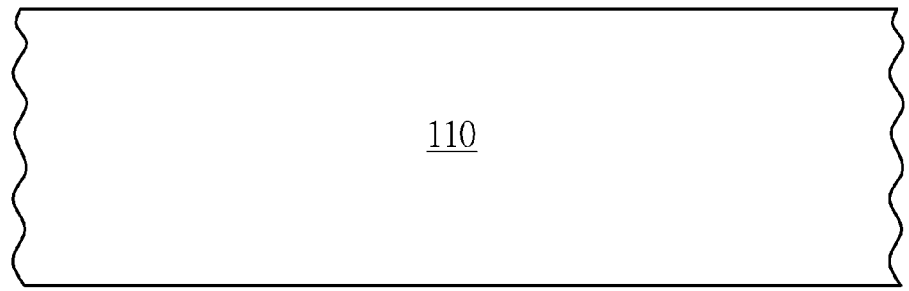
FIGS. 1-8 schematically depict cross-sectional views of a fabricating method of a lateral-diffused metal oxide semiconductor device according to an embodiment of the present invention.
Figure 2:
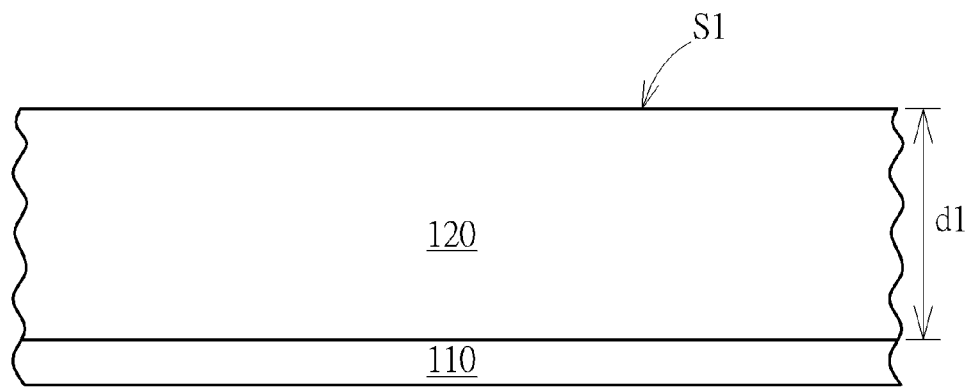

FIGS. 1-8 schematically depict cross-sectional views of a fabricating method of a lateral-diffused metal oxide semiconductor device according to an embodiment of the present invention. As shown in FIG. 1, a substrate 110 is provided, wherein the substrate 110 may be a semiconductor substrate such as a silicon substrate, a silicon-containing substrate, or a silicon-on-insulator substrate. As shown in FIG. 2, a third deep well 120 is formed in the substrate 110 by processes such as an implantation process. The third deep well 120 has a first conductive type while the substrate 110 has a second conductive type. The first conductive type and the second conductive type have different electrical properties. In this embodiment, the first conductive type is N-type while the second conductive type is P-type, but it is not limited thereto. In another embodiment, the first conductive type may be P-type while the second conductive type is N-type.

In this embodiment, the third deep well 120 is located from a top surface S1 of the substrate 110 to a depth d1. In another embodiment, the third deep well 120 may be an embedded well, meaning it may be located just in a middle part of the substrate 110, and the third deep well 120 may have a dopant concentration higher than later formed upper wells, but it is not limited thereto. The position and the range of the third deep well 120 depend upon the needs. The third deep well 120 is used for electrical isolation, thus preventing leakage current from flowing downward.

Figure 3:
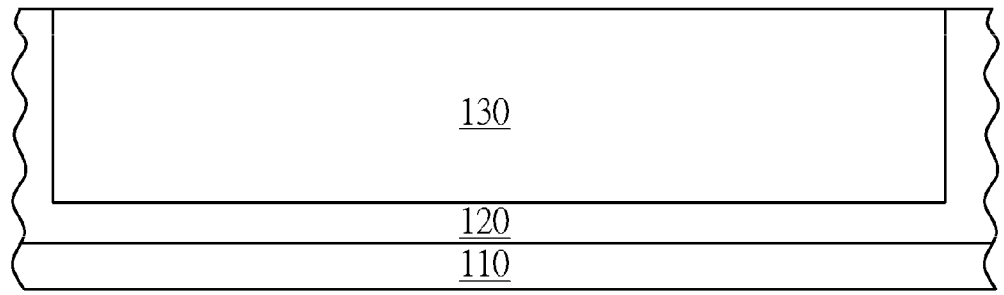
Figure 4:
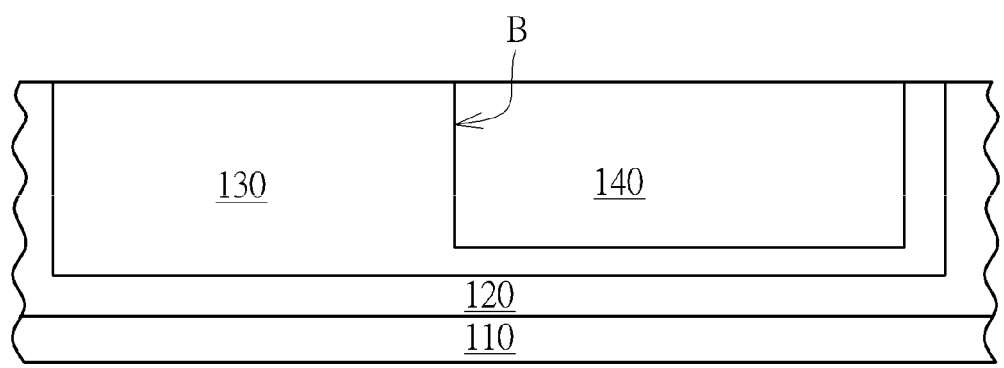

As shown in FIG. 3, a first deep well 130 is formed in the third deep well 120 by processes such as an implantation process. The first deep well 130 has a first conductive type. As shown in FIG. 4, a second deep well 140 with a second conductive type is formed in the first deep well 130. The second deep well 140 is merely doped in a right part of the first deep well 130, so a later formed gate can be disposed across a boundary B of the first deep well 130 and the second deep well 140.

Figure 5:
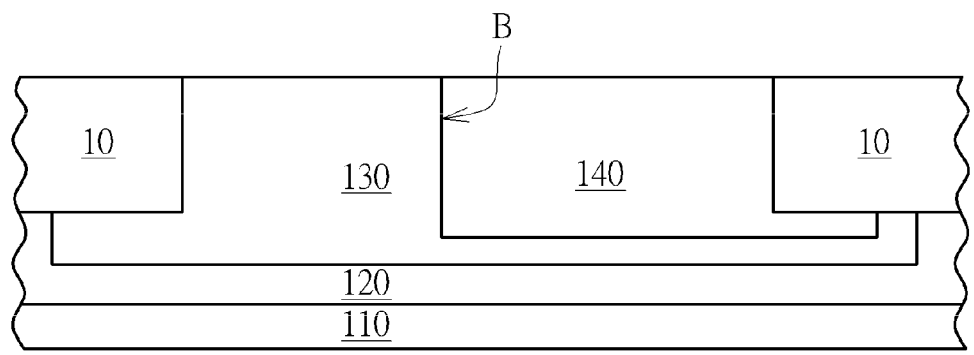

As shown in FIG. 5, isolation structures 10 are formed in the substrate 110. The isolation structures 10 may be shallow trench isolation structures, which may be formed by a shallow trench isolation process, but it is not limited thereto. In this embodiment, the isolation structures 10 and the third deep well 120 surround the first deep well 130 and the second deep well 140 for electrically isolating components formed in/on the first deep well 130 and the second deep well 140 from others. Preferably, the isolation structures 10 contacts the third deep well 120 for better electrical isolation.

Figure 6:
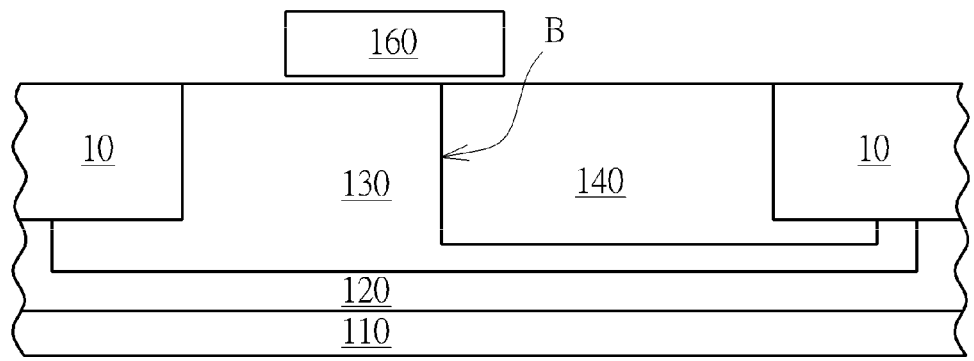

As shown in FIG. 6, a gate 160 is formed on the substrate 110 and the gate 160 is on the boundary B of the first deep well 130 and the second deep well 140. Thus, an asymmetric structure is formed in the present invention. The gate 160 is a polysilicon gate, but it is not limited thereto. In another embodiment, the gate 160 may be a metal gate, or the polysilicon gate may be replaced by a metal gate in later processes. The gate 160 may include a gate dielectric layer, a gate layer, a cap layer and a spacer, etc., which are known in the art, and are not described herein.

Figure 7:
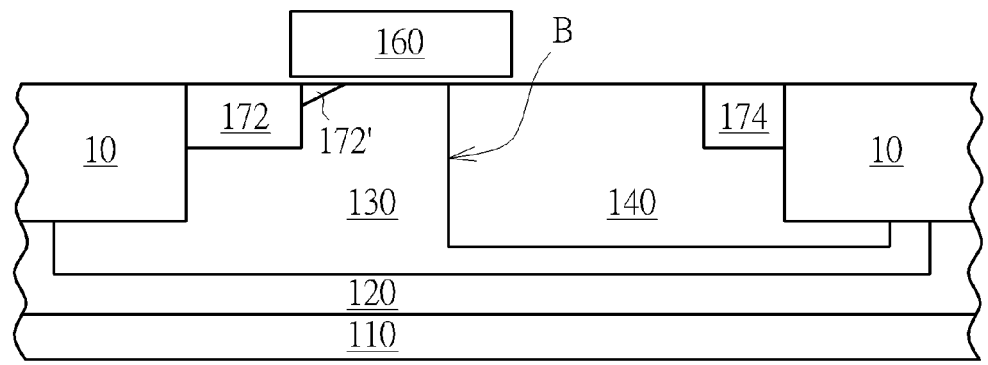

As shown in FIG. 7, a source 172 and a drain 174 are formed in the first deep well 130 and in the second deep well 140 respectively and beside the gate 160. The source 172 and the drain 174 have second conductive type. The doping concentration of the source 172 and the drain 174 is higher than the doping concentration of the first deep well 130 and the second deep well 140. Furthermore, a lightly doped source 172' or a lightly doped drain (not shown) may be formed in the substrate 110 beside the gate 160 or at least having a part under the gate 160 before the source 172 and the drain 174 are formed or by the diffusion of the source and the drain 174. In this embodiment, the lightly doped source 172' is under the gate 160 and having a gradient depth increasing toward the source 172. The source 172, the drain 174, the lightly doped source 172' and the lightly doped drain (not shown) may be formed by covering a patterned mask (not shown) and then performing an implantation process, which may be a vertical implantation process or a tilt implantation process; or, may be formed by self-aligning through spacers, but it is not limited thereto.

Figure 8:
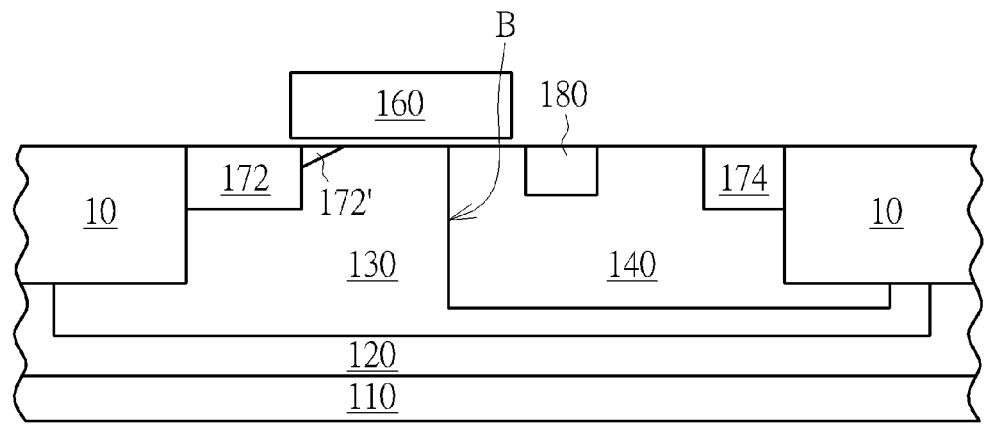

As shown in FIG. 8, a first dopant region 180 is formed in the second deep well 140 and the first dopant region 180 is between the gate 160 and the drain 174. The first dopant region 180 may be formed by covering a patterned mask and then performing an implantation process, but it is not limited thereto. The doping concentration of the first dopant region 180 is higher than the doping concentration of the second deep well 140. It is emphasized that, the first dopant region 180 is separated from the drain 174 and the first dopant region 180 has a first conductive type. Therefore, P-N junctions exist between the first dopant region 180 and the second deep well 140, thereby reducing circuit leakage. Thus, the off current ($I_{off}$) of a formed lateral-diffused metal oxide semiconductor device can be reduced. Furthermore, the first dopant region 180 is a surface dopant region, so that the surface electric field is reduced. Preferably, the first dopant region 180 is right next to the gate 160, so the local high surface electric field under the edge of the gate 160 can be reduced.

Figure 9:
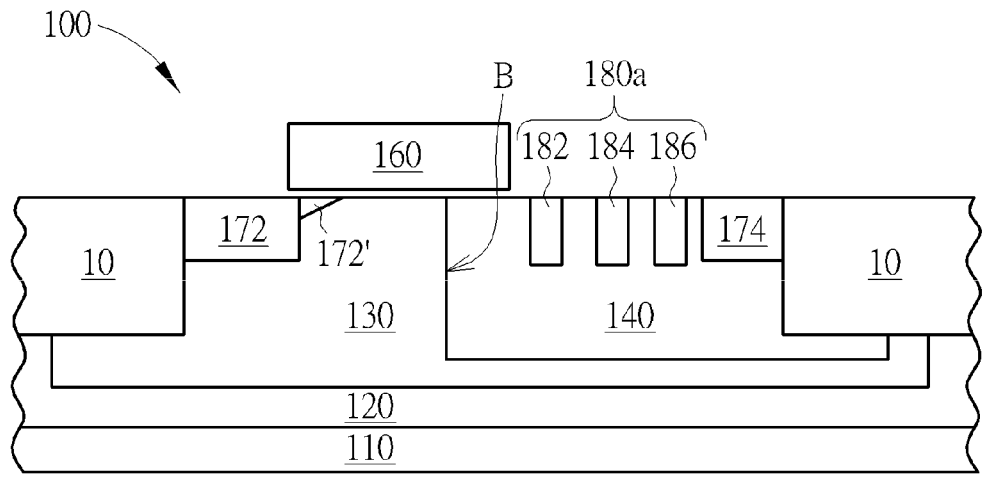
FIG. 9 schematically depicts a cross-sectional view of a fabricating method of a lateral-diffused metal oxide semiconductor device according to another embodiment of the present invention.

In the embodiment of FIG. 8, the first dopant region 180 is just one dopant region, but the first dopant region 180 may include several dopant regions to generate more P-N junctions. FIG. 9 schematically depicts a cross-sectional view of a fabricating method of a lateral-diffused metal oxide semiconductor device according to another embodiment of the present invention. As shown in FIG. 9, after the source 172 and the drain 174 are formed, a first dopant region 180a having several dopant regions 182, 184, 186 is formed in the second deep well 140 and the several dopant regions 182, 184, 186 are located between the gate 160 and the drain 174. It is emphasized that, the several dopant regions 182, 184, 186 are separated from each other, so that several corresponding P-N junctions exist between the several dopant regions 182, 184, 186 and the second deep well 140. Therefore, this embodiment can have better performances such as reducing circuit leakage and surface electric field than the embodiment of FIG. 8, which just has one dopant region between the gate 160 and the drain 174.

Figure 10:
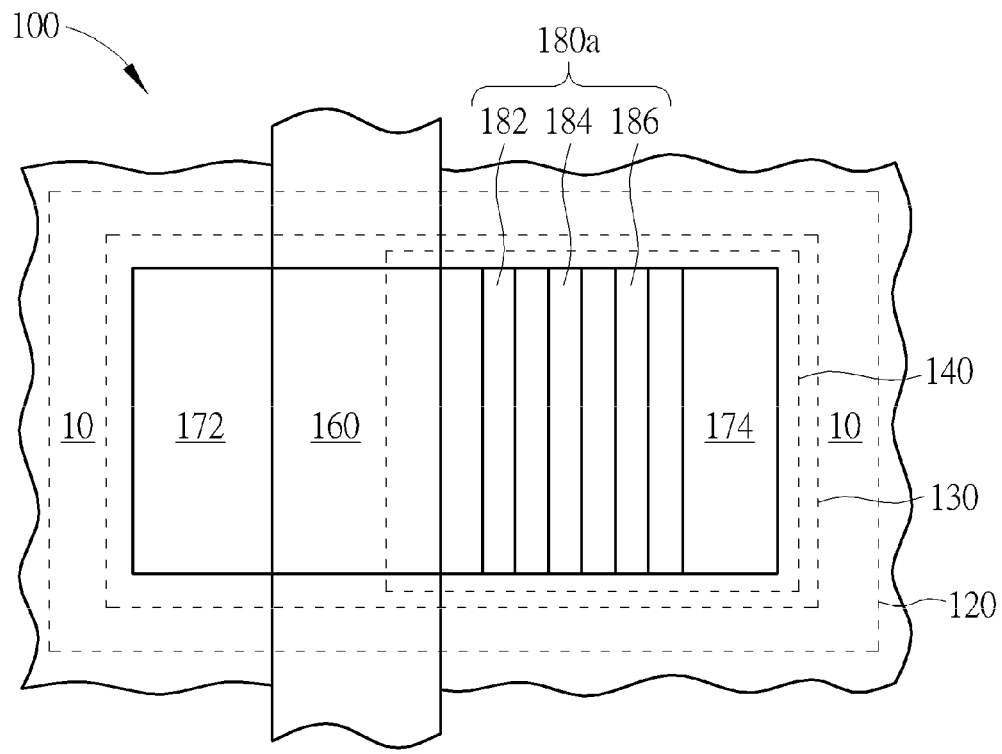
FIG. 10 schematically depicts a top view of a lateral-diffused metal oxide semiconductor device of FIG. 9.

Therefore, a lateral-diffused metal oxide semiconductor device 100 is formed completely. FIG. 10 schematically depicts a top view of a lateral-diffused metal oxide semiconductor device of FIG. 9. Please refer to FIGS. 9-10, a lateral-diffused metal oxide semiconductor device 100 includes a substrate 110, a first deep well 130, a second deep well 140, a gate 160, a source 172, a drain 174 and a first dopant region 180a. The first deep well 130 is in the substrate 110. The substrate 110 has a second conductive type while the first deep well 130 has a first conductive type. The second deep well 140 is disposed in the first deep well 130 and has a second conductive type. The gate 160 is disposed on the substrate 110. It is noted that the gate 160 is disposed on the boundary B of the first deep well 130 and the second deep well 140, thereby the lateral-diffused metal oxide semiconductor device is an asymmetric structure. The source 172 and the drain 174 having a second conductive type are disposed beside the gate 160 and in the first deep well 130 and the second deep well 140 respectively. The first dopant region 180a is disposed just in the second deep well 140. It is noted that, the first dopant region 180a is located between the gate 160 and the drain 174, and the first dopant region 180a is separated from the drain 174 for having P-N junctions existing between the first dopant region 180a and the second deep well 140. In this embodiment, the first dopant region 180a has several dopant regions separated from each other to form many P-N junctions and the several dopant regions are arranged regularly, but it is not limited thereto. The first dopant region 180a may just be one as the case of FIG. 8 or the arrangements of the dopant region 180 may be irregular, depending upon the needs.

Furthermore, the third deep well 120 surrounds the first deep well 130 and the second deep well 140. The isolation structures 10 are located in the substrate 110 and at the sides of the source 172 and the drain 174 opposite to the first dopant region 180a, so that the third deep well 120 can contact the isolation structures 10 to fully isolate components formed in/on the first dopant region 180. As a result, the lateral-diffused metal oxide semiconductor device 100 of the present invention includes the gate 160, the first dopant region 180a, the drain 174 and the isolation structure 10 with the arrangement sequentially.

In the aforesaid embodiments, the first dopant region 180, 180a is just in the second deep well 140 and between the gate 160 and the drain 174, while there is just the source 172 in the first well 130 and between the gate 160 and the isolation 10. However, in another embodiment, there may be another first dopant region (not shown) disposed in the first deep well 130 and between the source 172 and the gate 160 for achieving purposes such as reducing circuit leakage, surface electric field, etc.

To summarize, the present invention provides a lateral-diffused metal oxide semiconductor device and fabrication method thereof, which forms the first dopant region between the gate and the drain for having PN-junctions existing between the first dopant region and the second deep well, to reduce circuit leakage and thus reducing off current ($I_{off}$). The first dopant region is a surface dopant region, for reducing the surface electric field. Moreover, the first dopant region may be just one dopant region right next to the gate for reducing local high surface electric field, or may be several dopant regions separated from each other for having more PN-junctions existing between the first dopant region and the second deep well.

Furthermore, the lateral-diffused metal oxide semiconductor device may further include the isolation structures, so the gate, the first dopant region, the drain and the isolation structure can be arranged sequentially to isolate the formed lateral-diffused metal oxide semiconductor device from others. Moreover, a third deep well may surround the first deep well and preferably contact the isolation structure for isolation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of a lateral-diffused metal oxide semiconductor device, comprising:
   providing a substrate;
   forming a first deep well with a first conductive type in the substrate;
   forming a second deep well with a second conductive type in the first deep well;
   forming a gate on the substrate and the boundary of the first and the second deep well;
   forming a source and a drain in the first deep well and in the second deep well respectively beside the gate; and
   forming a first dopant region having a first conductive type in the second deep well and separated from the drain, wherein the first dopant region comprises several dopant regions, and all of the several dopant regions are not directly below the gate.

2. The fabricating method of the lateral-diffused metal oxide semiconductor device according to claim 1, wherein the first dopant region is between the gate and the drain.

3. The fabricating method of the lateral-diffused metal oxide semiconductor device according to claim 1, wherein the first dopant region comprises one dopant region right next to the gate.

4. The fabricating method of the lateral-diffused metal oxide semiconductor device according to claim 1, wherein the substrate has a second conductive type, and the first conductive type is different from the second conductive type.

5. The fabricating method of the lateral-diffused metal oxide semiconductor device according to claim 1, wherein the several dopant regions are separated from each other.

6. The fabricating method of the lateral-diffused metal oxide semiconductor device according to claim 1, further comprising:
   forming a third deep well in the substrate after the substrate is provided.

7. The fabricating method of the lateral-diffused metal oxide semiconductor device according to claim 6, wherein the third deep well has a first conductive type.

8. The fabricating method of the lateral-diffused metal oxide semiconductor device according to claim 6, further comprising:
   forming isolation structures in the substrate and at sides of the source and the drain opposite to the first dopant region after the second deep well is formed.

9. The fabricating method of the lateral-diffused metal oxide semiconductor device according to claim 8, wherein the third deep well contacts the isolation structures to surround the first deep well and the second deep well.

10. The fabricating method of the lateral-diffused metal oxide semiconductor device according to claim 1, wherein the first dopant region is a surface dopant region.

11. The fabricating method of the lateral-diffused metal oxide semiconductor device according to claim 1, wherein the gate is only disposed on the boundary of the first and the second deep well, and the source is only in the first deep well.

12. A fabricating method of a lateral-diffused metal oxide semiconductor device, comprising:
   providing a substrate;
   forming a first deep well with a first conductive type in the substrate;
   forming a second deep well with a second conductive type in the first deep well;
   forming a gate on the substrate and only on the boundary of the first and the second deep well;
   forming a source and a drain only in the first deep well and in the second deep well respectively beside the gate; and
   forming a first dopant region having a first conductive type in the second deep well and separated from the drain, wherein the first dopant region comprises several dopant regions and is not directly below the gate.

* * * * *